United States Patent [19]
Banghart et al.

[11] Patent Number: 5,448,089
[45] Date of Patent: Sep. 5, 1995

[54] CHARGE-COUPLED DEVICE HAVING AN IMPROVED CHARGE-TRANSFER EFFICIENCY OVER A BROAD TEMPERATURE RANGE

[75] Inventors: Edmund K. Banghart; Edward T. Nelson, both of Pittsford; William F. DesJardin, Rochester; James P. Lavine, Rochester; Bruce C. Burkey, Rochester, all of N.Y.

[73] Assignee: Eastman Kodak Company, Rochester, N.Y.

[21] Appl. No.: 219,758

[22] Filed: Mar. 29, 1994

Related U.S. Application Data

[63] Continuation of Ser. No. 988,068, Dec. 9, 1992, abandoned.

[51] Int. Cl.$^6$ .................. H01L 29/78; H01L 31/00; H01L 27/14
[52] U.S. Cl. ................... 257/222; 257/219; 257/240
[58] Field of Search ............. 257/216, 222, 236, 237, 257/240, 260, 224, 243, 221, 232, 241, 248, 250

[56] References Cited

U.S. PATENT DOCUMENTS

| | | | |
|---|---|---|---|
| 3,902,066 | 8/1975 | Roosild et al. | 250/332 |
| 4,613,402 | 9/1986 | Losee et al. | 156/643 |
| 4,667,213 | 5/1987 | Kosonocky | 257/219 |
| 4,809,048 | 2/1989 | Kimata et al. | 257/219 |
| 4,821,081 | 4/1989 | Hynecek | 257/219 |
| 4,910,569 | 3/1990 | Erhardt | 257/246 |

(List continued on next page.)

OTHER PUBLICATIONS

E. K. Banghart et al., "A Model for Charge Transfer in Buried-Channel Charge-Coupled Devices at Low Temperature", *IEEE Transactions on Electron Devices*, vol. ED-38, No. 5 (May 1991) pp. 1162–1174.

S. M. Sze, *Physics of Semiconductor Devices*, 2nd Ed., John Wiley, New York, 1981, pp. 412–415.

A. L. Lattes, et al., "Ultrafast Shallow-Buried Channel CCD;s with Built-in Drift Fields", *IEEE Electron Device Letters*, vol. 12, No. 3 (Mar. 1991) pp. 104–107.

A. L. Lattes, et al., "Improved Drift in Two-Phase, Long-Channel, Shallow Buried-Channel CCD's with Longitudinally Nonuniform Storage-Gate Implants", *IEEE Transactions on Electron Devices*, vol. 39, No. 7 (Jul. 1992), pp. 1772–1774.

Jaroslav Hynecek, "Virtual Phase Technology: A New Approach to Fabrication of Large-Area CCD's", IEEE Transactions On Electron Devices, vol. ED-28, No. 5 (May 1981) pp. 483–489.

Dollekamp, et al., "P$^2$CCD in 60 MHz oscilloscope (List continued on next page.)

*Primary Examiner*—Rolf Hille
*Assistant Examiner*—David B. Hardy
*Attorney, Agent, or Firm*—James D. Leimbach

[57] ABSTRACT

A charge-coupled device having an improved charge-transfer efficiency over a broad temperature range. The device comprises a substrate of semiconductor material of one conductivity type; a first buried channel formed in the substrate and of a conductivity type opposite to that of the substrate; a second buried channel of a conductivity type opposite to that of the substrate formed in the same region of the substrate as the first buried channel and having a greater depth of penetration into the substrate than the first buried channel; compensated regions formed at intervals in the buried channels providing a means for containing individual packets of charge and shaped for inducing a narrow channel effect and for producing a fringing electric field in a direction of charge transfer in uncompensated buried channel regions; electrode gates associated with each pair of adjoining compensated and uncompensated regions in the device; and means for clocking the electrodes for causing a string of charge packets to be transferred through the device.

19 Claims, 10 Drawing Sheets

U.S. PATENT DOCUMENTS

| | | | |
|---|---|---|---|
| 4,949,143 | 8/1990 | Iesaka et al. | 257/220 |
| 5,093,849 | 3/1992 | Goto | 257/236 |
| 5,151,380 | 9/1992 | Hynecek | 437/53 |
| 5,189,498 | 2/1993 | Sakakibara | 257/249 |
| 5,323,034 | 6/1994 | Furumiya | 257/221 |

OTHER PUBLICATIONS with digital image storage", *Philips Tech. Rev.* 40, 1982, No. 2/3 pp. 55–69.

M. G. Collet and A. C. Vliegenthart, "Calculations on Potential and Charge Distributions In The Peristaltic Charge-Coupled Device", *Philips Res. Repts.* vol. 29, 1974, pp. 25–44.

M. Kimata et al., "Low-Temperature Characteristics of Buried-Channel Charge-Coupled Devices", *Japanese Journal of Applied Physics,* vol. 22, No. 6, Jun. 1983, pp. 975–980.

Bjorn F. Andersen, et al., "Infrared Technology XVII", *Proceedings of SPIE-The International Society for Optical Engineering,* vol. 1540, (1991) pp. 580–595.

FIG. I

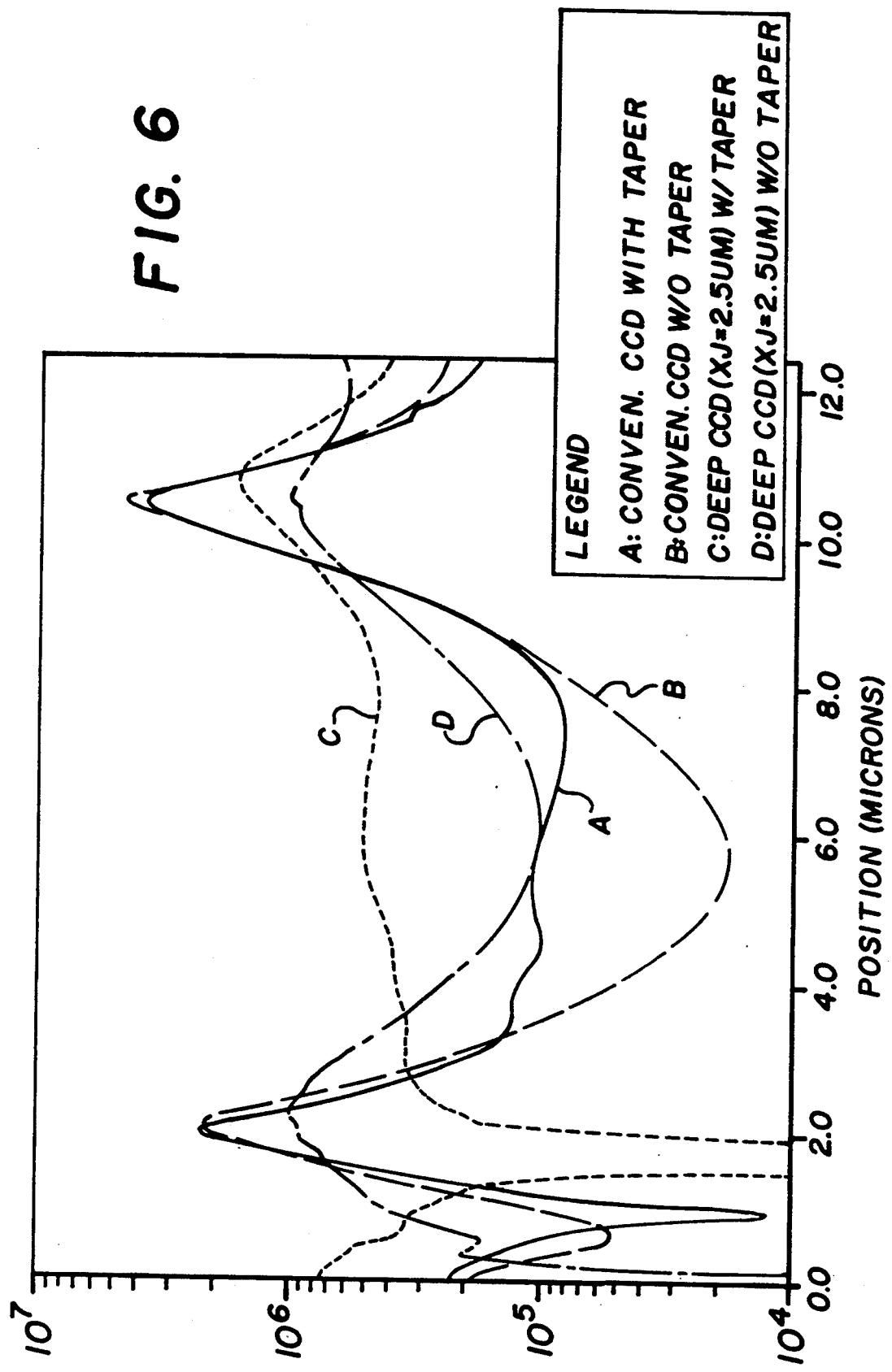

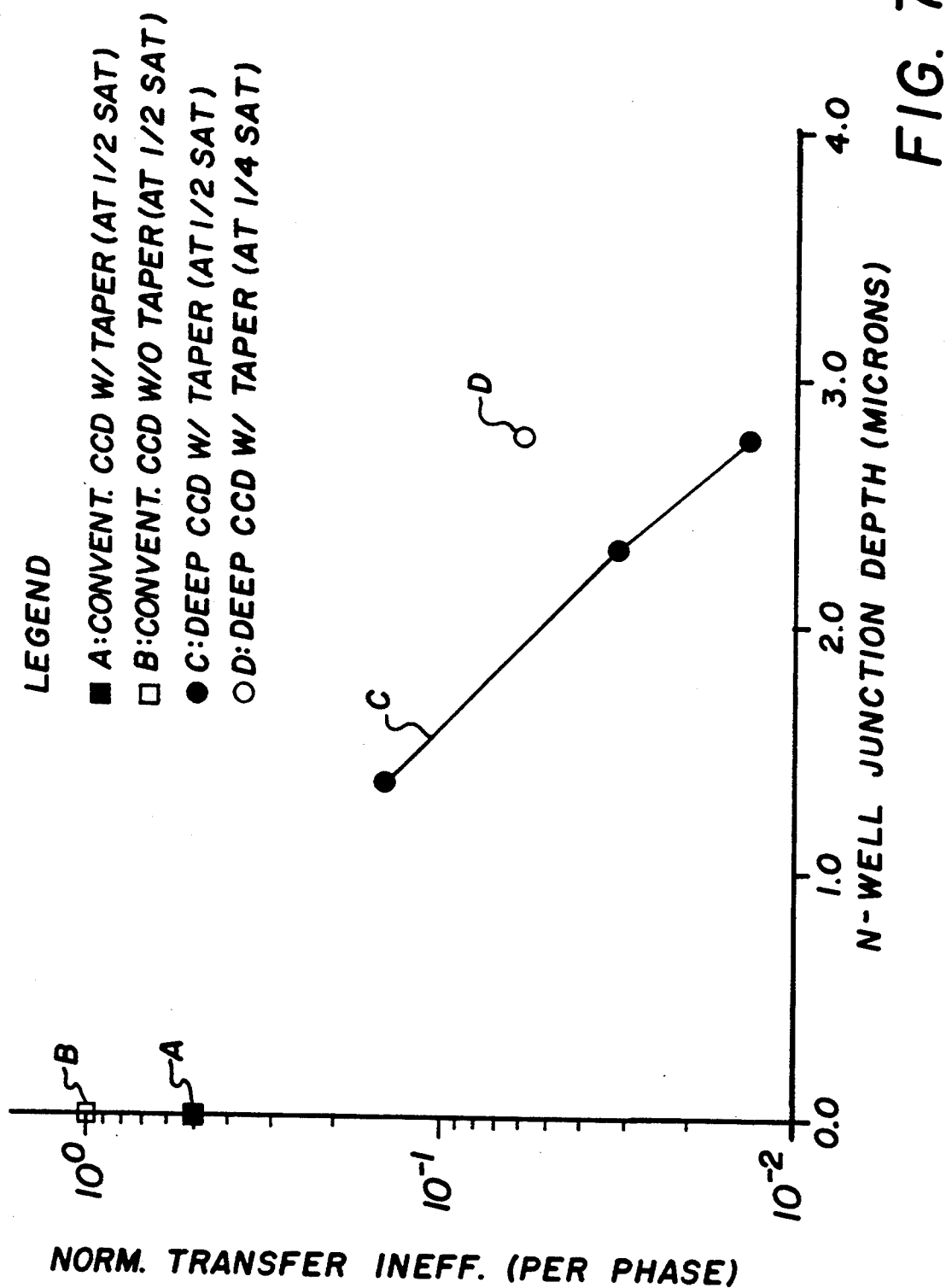

CHARGE-COUPLED DEVICE HAVING AN IMPROVED CHARGE-TRANSFER EFFICIENCY OVER A BROAD TEMPERATURE RANGE

This is a continuation of U.S. application Ser. No. 988,068, filed 09 Dec. 1992, now abandoned.

FIELD OF THE INVENTION

The present invention relates to a charge-coupled device (CCD) having an improved charge-transfer efficiency, and suitable for use over a broad temperature range.

BACKGROUND OF THE INVENTION

Charge-coupled devices (CCD's) comprising a buried channel are well-known solid-state transfer devices that may be employed, for example, as image sensors or for charge transport.

SUMMARY OF THE INVENTION

It is important to examine device performance over a broad temperature range, since charge-transfer efficiency can be a strong function of temperature. Conversely, it is desired to optimize the charge-transfer efficiency, independent of temperature. Restated, it is the intention of this document to disclose a charge coupled device providing efficient charge transfer not only at room temperature, but all temperatures, including those much lower than room temperature.

For example, an infrared CCD image sensor is preferably operated at a low temperature, typically that of liquid nitrogen (77K), in order to provide an effective suppression of dark current and therefore a desired sensitivity to the infrared radiation. (See U.S. Pat. No. 3,902,066, to Roosild et al.). However, at low temperatures, an efficient transfer of charge may be complicated by a phenomena known as carrier freeze-out. This phenomena suggests that at low temperatures, electrons are not entirely free, but may be trapped by donor atoms of a CCD buried channel, thereby requiring periods of time greater than a transfer period; in order to be emitted from a potential well of the donor atom. As a result, charge-transfer efficiencies may be poor at low temperatures, thereby producing less desirable images.

Methods for improving the charge-transfer efficiency at low temperatures preferably start from a premise that a barrier to emission for electrons trapped in the potential wells of the donor atoms, can be lowered by application of strong electric fields through a process known as a Poole-Frenkel effect. (See an article of E. K. Banghart, J. P. Lavine, E. A. Trabka, E. T. Nelson, and B. C. Burkey, entitled "A Model for Charge Transfer in Buried-Channel Charge-Coupled Devices at Low Temperature", *IEEE Transactions on Electron Devices*, Vol. ED-38, No. 5, May 1991, pages 1162-1174.) Thus, by means of the Poole-Frenkel effect, the charge-transfer efficiency at low temperature can be improved by increasing electric field strengths which arise from an electrostatic coupling of adjacent phases of a CCD, and from gradients in the vertical doping profile.

Known methods for improving the charge-transfer efficiencies for low and high temperatures comprise an employment of a high multiplicity of electrodes per phase, to impose potential differences over relatively shorter distances, thereby producing higher electric fields. Illustrative such three and four-phase clocking techniques are disclosed in S. M. Sze, *Physics of Semiconductor Devices*, 2nd Ed., John Wiley, New York, 1981, page 415. We note, however, an important disadvantage of this particular technique, namely, it may add a fabrication complexity due to a need for additional conducting layers, and to an additional number of clocks to be enclosed in an infrared camera system.

Further, with reference to low and high temperature charge-transfer efficiencies it is known to create, by means of multiple ion implantations, regions within a phase with different channel potentials, thereby realizing higher fringing fields with a minimum number of phases, e.g., two phases. See, for example, a disclosure of A. L. Lattes, Scott C. Munroe and M. M. Seaver entitled "Ultrafast Shallow-Buried Channel CCD's with Built-in Drift Fields", *IEEE Electron Device Letters*, Vol. 12, No. 3, March 1991, pages 104-107 and a disclosure of A. L. Lattes, S. C. Munroe, M. M. Seaver, J. E. Murguia, and J. Melngailis entitled "Improved Drift in Two-Phase, Long-Channel, Shallow Buried-Channel CCD's with Longitudinally Nonuniform Storage-Gate Implants", *IEEE Transactions On Electron Devices*, Vol. 39, No. 7, July 1992, pages 1772-1774. We note, however, an important disadvantage of this technique, namely, it may result in added complexities due to a need for additional masking levels and implantation steps.

With reference to room temperature charge-transfer efficiencies, only, it is known that a tapered pattern can be used to induce an electric field in the direction of charge-transfer by means of a "channel narrowing" effect. See, for example, U.S. Pat. No. 4,821,081 to Hynecek, which is particularly referenced to a design of a CCD device comprising a virtual phase technology. (See also the disclosure of Jaroslav Hynecek entitled "Virtual Phase Technology: A New Approach to Fabrication of Large-Area CCD's", *IEEE Transactions on Electron Devices*, Vol. ED-28, No. 5, May 1981, pages 483-489.)

Advantages of the tapered pattern technique include providing continuous variation in channel potential, eliminating the need for multiple ion implantation, and eschewing the need for a high multiplicity of phase use.

However, as we will disclose in more detail later, and based upon simulation, the use, for example, of such a tapered pattern in a long phase (greater than 10.0 $\mu$m) CCD horizontal transfer register with conventional buried channels, may provide efficient charge transfer for only a limited number (e.g., 250-350) of transfers. As a consequence, for a large format PtSi Schottky barrier detector array, multiple output operation may be required to ensure efficient charge transfer. However, multiple outputs would be undesirable, not only because of required additional electronic processing, but because of artifacts visible in a recomposed video image.

We now turn our attention to another technique for improving charge-transfer efficiency at room temperature. This technique comprises using deep buried channels that preferably extend several microns into a substrate. Examples of this technique include a peristaltic CCD disclosed by Dollekamp et al. in "P$^2$CCD in 60 MHz oscilloscope with digital image storage", *Philips Tech. Rev.* 40, 1982, No. 2/3, pages 55-69, and modeled by Collet and Vliegenthart (disclosed in "Calculations on Potential and Charge Distributions in the Peristaltic Charge-Coupled Device", *Philips Res. Repts.* Vol. 29, 1974, pages 25-44).

The concept of a deep buried channel design is also known for low temperature operation. For example, Kimata et al. have disclosed and modeled the performance of a deep buried channel CCD for low temperature operation (see "Low-Temperature Characteristics of Buried-Channel Charge-Coupled Devices", *Japanese Journal of Applied Physics*, Vol. 22, No. 6, June, 1983, pages 975-980). Tsaur et al. also disclose a deep buried channel design for use at low temperature. (See Bjorn F. Andersen, Marija Scholl and Irving J. Spiro, "Infrared Technology XVII", *Proceedings of SPIE—The International Society for Optical Engineering*, Volume 1540, (1991), pages 580-595.)

We note that major disadvantages associated with the deep buried channel, as heretofore disclosed, include a lengthy time and elevated temperatures necessary to drive-in the channels after ion implantation, as well as a loss of charge capacity. Also, it is known that at low temperature the efficiency of charge transfer can be reduced when excessively large buried channel dosages are used, due to increased charge trapping which ultimately limits the frequency of operation and therefore the overall achievable resolution of the imager array.

We disclose a last technique for improving charge-transfer efficiencies at low temperature, which purports to enhance the barrier emission process by placing narrow, supplemental buried channel (stripe) implantations into a wider principal buried channel (see U.S. Pat. No. 4,667,213 to Kosonocky), or by creating variations in an oxide thickness perpendicular to the direction of charge transfer (see U.S. Pat. No. 4,809,048 to Kimata et al.). It has been found, however, that this method is effective only for low signal levels. For higher signal levels, a lack of strong electric fields in the principal buried channel (and therefore exposure of the electron charge to weaker electric fields) results in a loss of charge-transfer efficiency.

We now make the following summary assessment of the above discussion. We uniquely define for ourselves the problem of providing a CCD having an improved charge-transfer efficiency over a broad temperature range, and one, moreover, that realizes simplicity of fabrication and lower manufacturing cost. The prior art does not suggest this systematic approach, but is rather variously and inclusively pegged to either a low temperature (e.g., 77K) or a room temperature approach. Moreover, within this piecemeal approach, prior art advantages are set forth which may be offset by problems or deficiencies, as we have noted.

In accordance with our systematic approach, we now disclose a device suitable for use in a CCD having an improved charge-transfer efficiency over a broad temperature range.

The device preferably comprises an improved horizontal charge-coupled device shift register for incorporation in a full frame, interline or linear CCD. The improved charge-transfer efficiency corresponds to an enhanced speed of operation, a characteristic particularly desired in a horizontal shift register. We note that this advantage can be extended, as well, to a vertical shift register.

As indicated, the device of the present invention has an improved charge-transfer efficiency over a broad temperature range. For example, at low (liquid nitrogen) temperatures, and for example in a high resolution PtSi Schottky barrier array, a realization of the principles underlying the present invention includes advantages of high speeds, e.g., 12 MHz operation; and, at room temperature, high speeds of at least 12 MHz.

The device comprises:

a) a substrate of semiconductor material of one conductivity type;
b) a first buried channel formed in the substrate and of a conductivity type opposite to that of the substrate;
c) a second buried channel of a conductivity type opposite to that of the substrate formed in the same region of the substrate as the first buried channel and having a greater depth of penetration into the substrate than the first buried channel;
d) compensated regions formed at intervals in the buried channels for providing a means for containing individual packets of charge and shaped for inducing a narrow channel effect and for producing a fringing electric field in a direction of charge transfer in uncompensated buried channel regions;
e) electrode gates associated with each pair of adjoining compensated and uncompensated regions in the device; and
f) means for clocking the electrodes for causing a string of charge packets to be transferred through the device.

An important advantage of the device as defined is that the second buried channel requires reduced time and energy during drive-in, compared to the prior art, gained through the use of the channel narrowing effect induced by the geometry of the compensated regions.

Another significant advantage is a capability for maintaining high charge capacity, notwithstanding the use of the deep buried channel, by virtue of the fact that the first buried channel preferably comprises a high concentration of impurities near the semiconductor surface.

Other important advantages of the present invention include these points: that the device comprising a horizontal shift register can be manufactured using two-phase technology, for example, in accordance with U.S. Pat. No. 4,613,402 to Losee et al., and incorporated by reference herein; and, the improved charge-transfer efficiency of the horizontal shift (transfer) register makes possible a single or simple output operation of a large format image sensor, thereby resulting in more compact CCD cameras with simplified electronics.

BRIEF DESCRIPTION OF THE DRAWINGS

The invention is illustrated in the accompanying drawings (not drawn to scale) in which:

FIG. 6 is a diagram of a channel electric field along a line A-A' of FIG. 3 for the various buried channel CCD designs considered in this disclosure;

FIG. 7 is a diagram of the measured transfer inefficiency as a function of junction depth of the n-well buried channel component. The values have been normalized to the case of a conventional, shallow buried channel device without tapering;

DETAILED DESCRIPTION OF THE INVENTION

Figure 1:
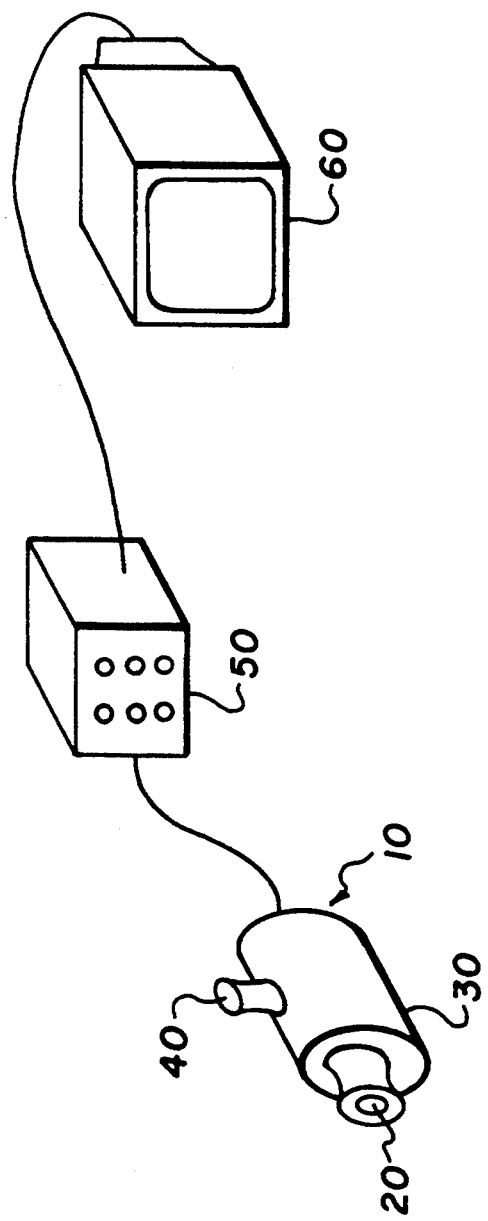
FIG. 1 is a schematic view of an infrared imaging system including a detector array, a camera with a cooling apparatus, a signal processing electronics, and a video display monitor.

The invention is preferably disclosed by way of FIG. 1. FIG. 1 shows an infrared image sensor array 10 and an optical system 20 enclosed in a tightly sealed camera 30. The camera 30 can be cooled to cryogenic temperatures by an introduction of liquid nitrogen into an aperture 40. The image sensor array 10 can produce a video signal which is preferably corrected for non-uniformities by an electronic system 50, for ultimate display on a video monitor 60.

Figure 2:
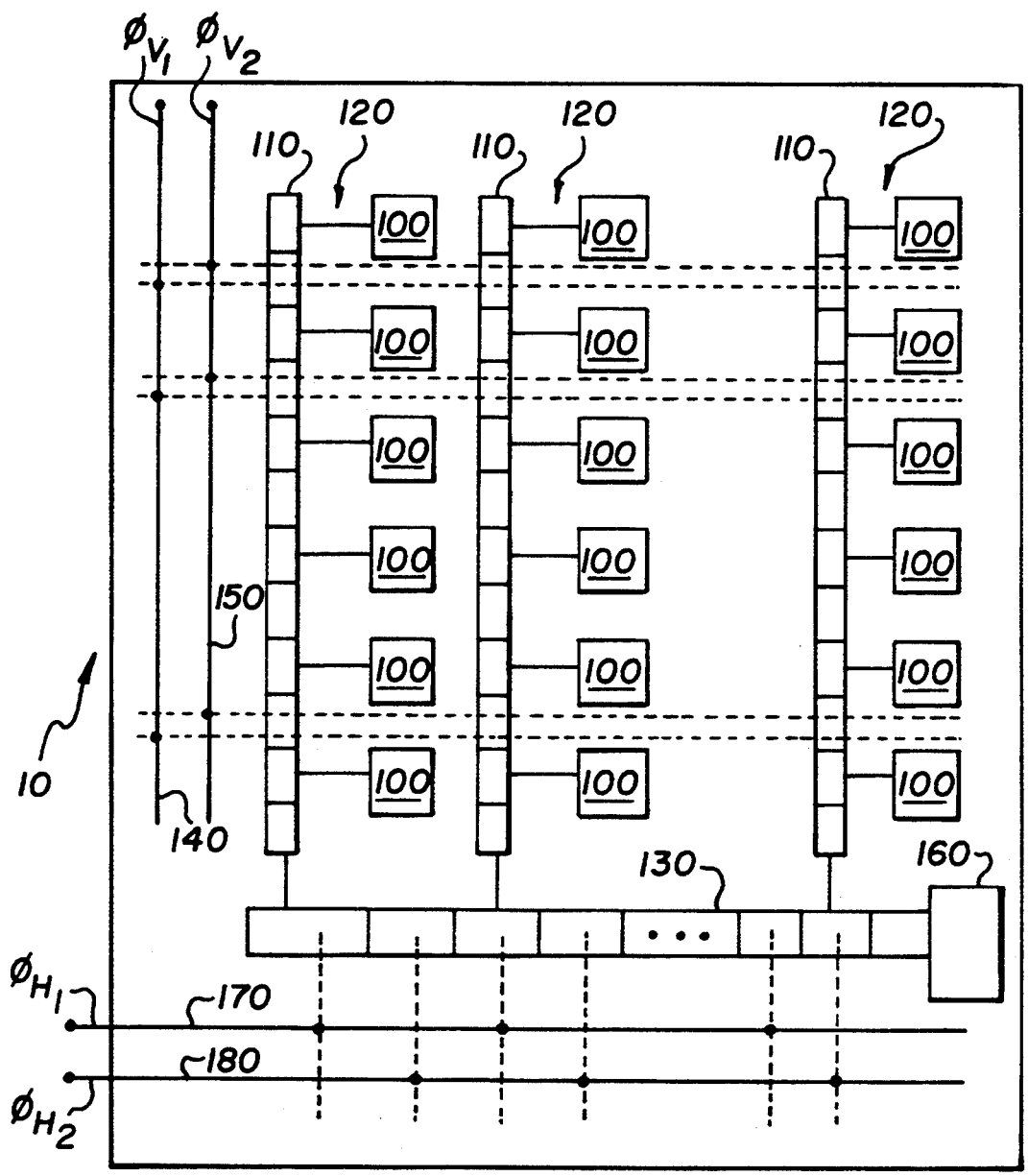
FIG. 2 is a schematic view of an infrared detector array comprising Schottky barrier detecting elements arranged in a two-dimensional matrix, and with an interline charge-coupled device multiplexer for signal readout.

Attention is now directed to FIG. 2, which shows an expanded schematic view of a preferred interline image sensor array 10. The image sensor array 10 comprises a two-dimensional matrix of infrared detecting elements 100 arranged into parallel vertical columns. The infrared detecting elements are preferably formed from the metal silicides, for example, platinum silicide (PtSi).

Associated with each column of detectors is a vertical transfer register 110 and a column of transfer gate elements 120. By appropriately biasing the transfer gate electrodes in a known way, charge packets generated in the detecting elements 100 can be passed through the transfer gate elements 120 into the vertical transfer register 110. The charge packets are transferred along the vertical transfer register 110 and passed into a single horizontal transfer register 130. Preferably, this action occurs by clocking two interconnecting metal gates 140,150 that connect respective phases in all vertical columns of the sensor array.

The charge packets in the horizontal register 130 are delivered to an output port 160, preferably by clocking two conducting gates 170,180 connecting respective phases within the horizontal register 130. Though a single output port is preferred, the output can be taken from multiple separate ports, thereby improving the charge-transfer efficiency. With N multiple output ports, the horizontal transfer register is divided into N equal portions, and the number of stages in each portion is 1/N times the total number of stages in the transfer register.

Figure 3:
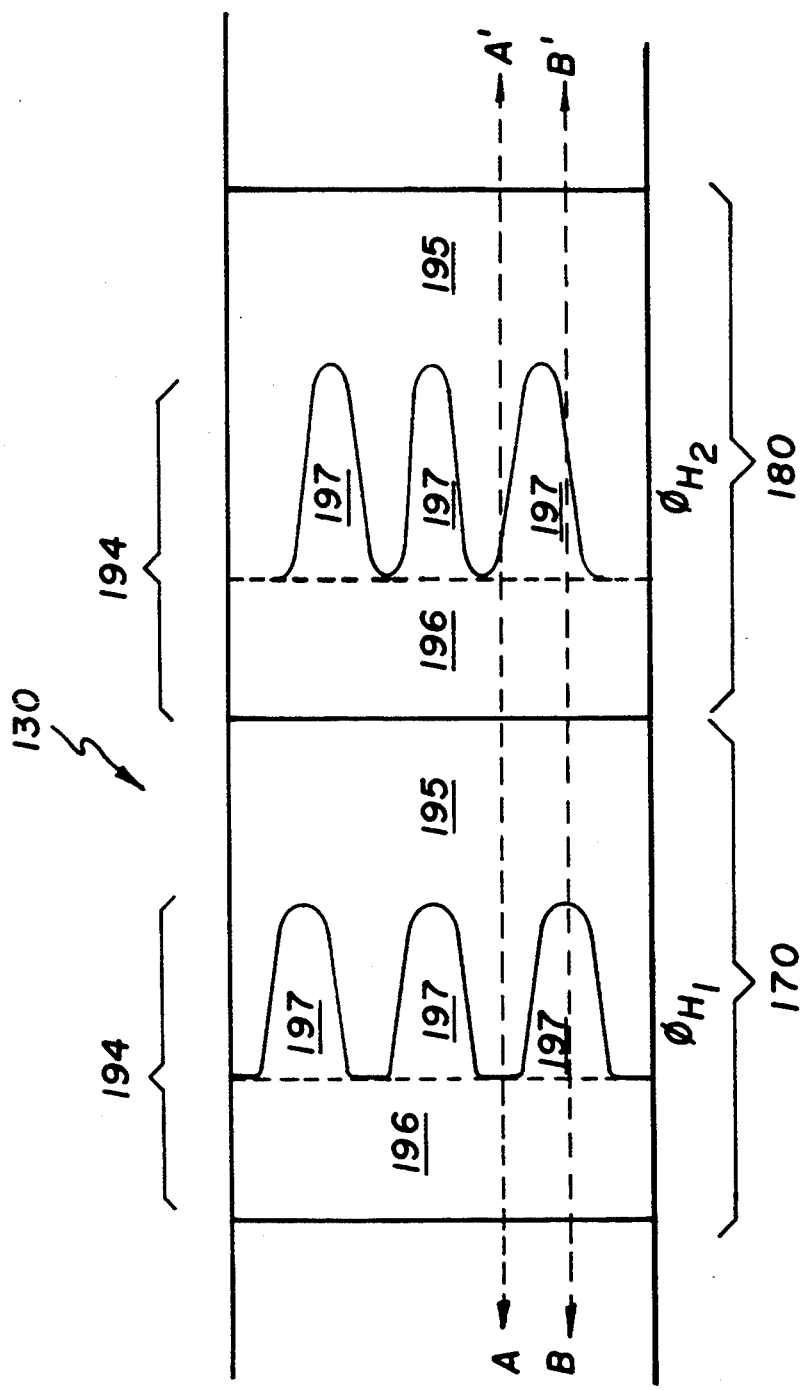
FIG. 3 is a top plan view of a representative portion of a horizontal transfer register.

FIG. 3 shows an expanded top plan view of the horizontal transfer register 130. Preferably, each phase of the horizontal transfer register 130 comprises a compensated (or barrier) region 194, and a non-compensated (or storage) region 195. The length of each phase, by way of example, is preferably 12.4 microns. However, a range of anywhere between 10 to 15 microns would also be effective.

The compensated region 194 preferably comprises a rectangular portion 196, and extended regions 197 that preferably gradually taper in width into the storage regions. The tapered portions preferably recur periodically, and preferably across the entire width of the horizontal transfer register 130. As examples, the rectangular portions 196 of the compensated regions are preferably 2 to 6 microns long, and the extended regions 197 are preferably 4 to 6 microns long, 2 to 5 microns wide, and are preferably set at a pitch of 3 to 5 microns.

As will be shown, infra, simulation studies demonstrate that such tapered geometries provide an enhanced electrical field in the direction of charge-transfer (i.e. towards the output port 160) by virtue of the channel narrowing effect, and as such, improve the charge-transfer efficiency of the image sensor array 10. For purposes of the present disclosure, we define the phrase "the channel narrowing effect" to mean the decrease in channel potential as the lateral dimensions of the channel become narrower, especially when these dimensions approach values on the order of the impurity profile depth. The resulting variation in channel potential along the direction of charge transfer thus gives rise to an electric field.

Figure 4A:
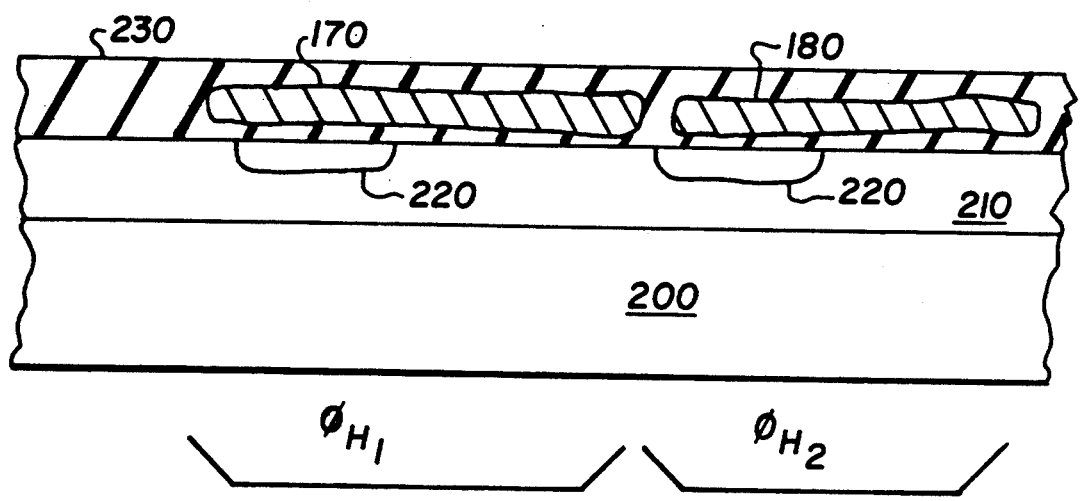
FIG. 4 shows (a) a sectional view along a line A-A' and (b) a sectional view along a line B-B' drawn in FIG. 3 for a single buried channel CCD of conventional depth.
Figure 4B:
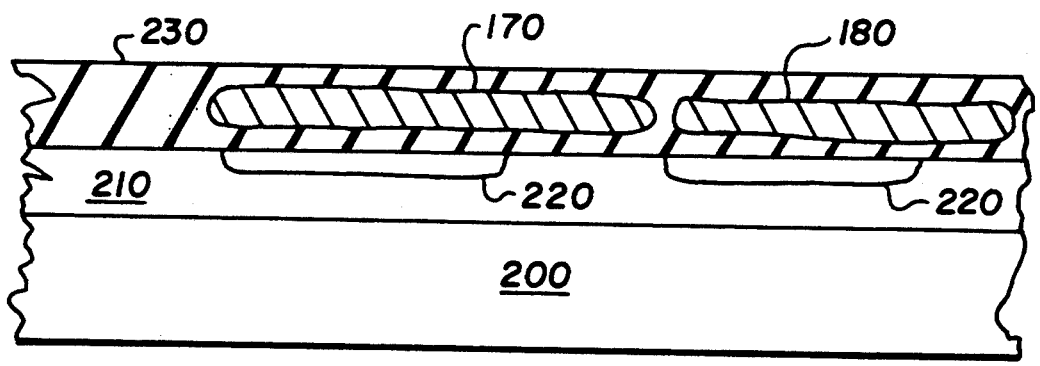

Attention is now directed to FIGS. 4A, 4B which provide cross-sectional views along lines A–A' and B–B', respectively, of FIG. 3. A buried channel 210 preferably having a depth less than a micron is formed in a conventional semiconductor substrate 200. A compensating implant 220 is then preferably made into regions 196 and 197 to form the barrier regions for the horizontal transfer register 130. Those regions that are not compensated, that is regions 195, then become the storage regions for the charge-transfer register. Also shown in FIG. 4 is a dielectric layer 230 that can insulate the active device region below the semiconductor surface from conducting electrode layers 170 and 180.

Figure 5:
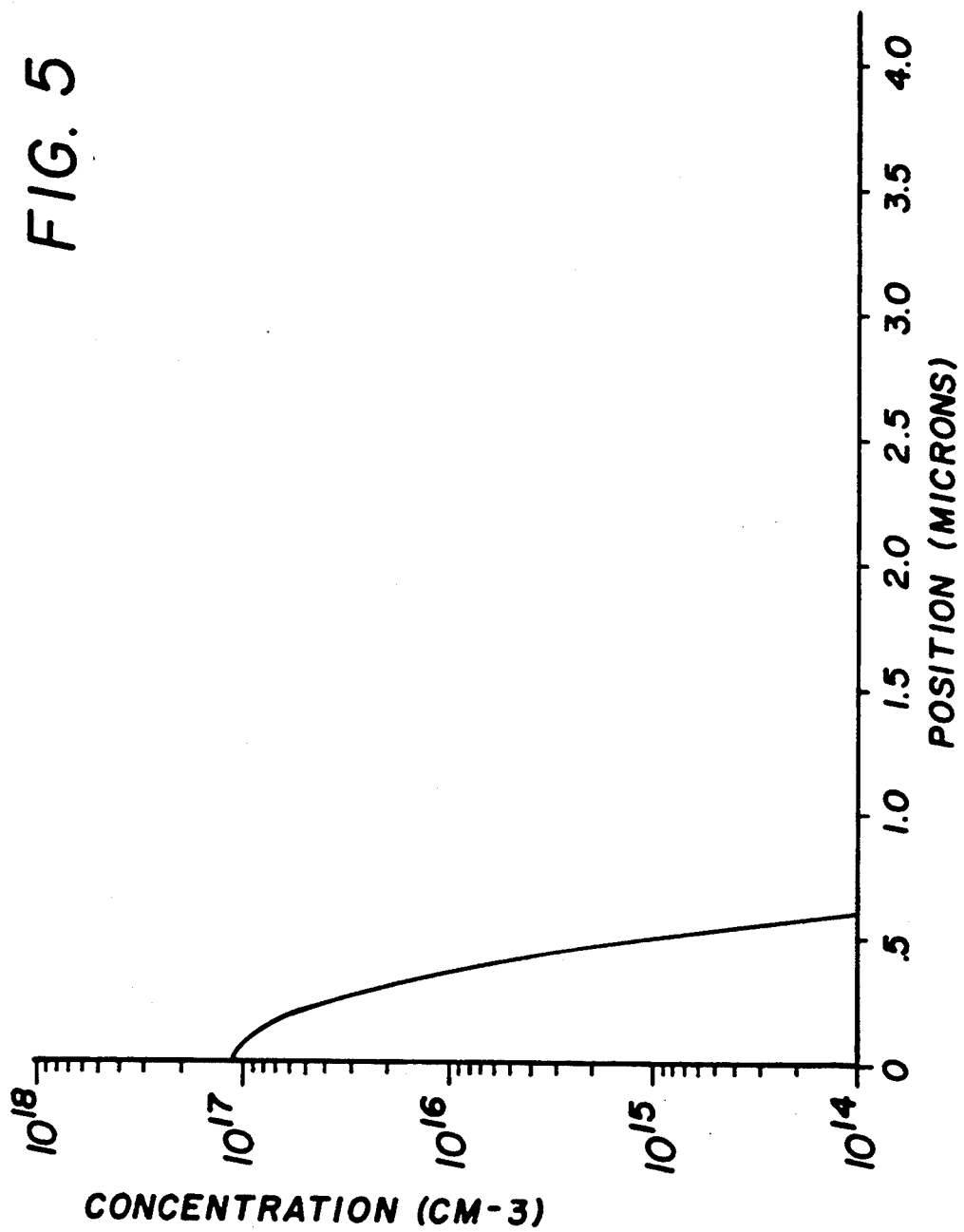
FIG. 5 is a diagram of an impurity profile for the single buried channel CCD of conventional depth shown in FIG. 4.

Preferably, a phosphorus implant is made into a high resistivity (20 to 100 ohm-cm) p-type silicon substrate to produce a channel potential in the storage region of approximately 6 to 10 volts. An impurity profile of the phosphorus buried channel appears in FIG. 5. The FIG. 5 profile, typical of prior art such profiles, is approximately 0.5 microns deep and has a surface concentration of approximately $10^{17}$ cm$^{-3}$.

Preferably, a compensating boron implant is then made to produce barrier regions with a channel potential approximately 3 to 5 volts less than the channel potential in the storage region.

Clocking potentials of 2.0 to 4.0 volts and of −7.0 to −5.0 volts are typical for the operation of the device just described.

The device may be simulated with a numerical program solving Poisson's equation in three dimensions, and based on conventional finite-difference methodologies. The channel electric field, obtained from the simulation, is presented as curve A, in FIG. 6. The cross section chosen to produce curve A, corresponding to the line A–A' shown in FIG. 3, provides a conservative estimate of the electric field strength for the entire structure, and represents the path along which the final amount of charge involved in the charge-transfer process most likely will pass. As shown by curve A, a minimum electric field strength of $8.26 \times 10^4$ V/m is attained near the very end of the phase, where the very last amount of stored electric charge awaits transfer to the next phase. Note that a "minimum" electric field strength provides not only a conservative measure of the entire field strength within the phase, but is the limiting field strength for the purposes of emission through the Poole-Frenkel process.

To illustrate the importance of the narrow channel effect, the tapered region 197 in FIG. 3 is removed. When a three-dimensional simulation along line A-A' is again made, but now without the taper, the electric field falls off dramatically, to a level of $1.85 \times 10^4$ V/m, at a position more nearly in the center of the phase and further from the phase edge, as evidenced by curve B of FIG. 6. The reduction of the field strength results in a loss of charge-transfer efficiency, as shown in FIG. 7.

In FIG. 7, the experimental results for charge-transfer efficiency are presented for the cases with (A) and without (B) the tapered region, and have been normalized to the value obtained for the device without the taper (B). The cases have been labeled so as to correspond with the curves presented in FIG. 6.

Figure 8A:
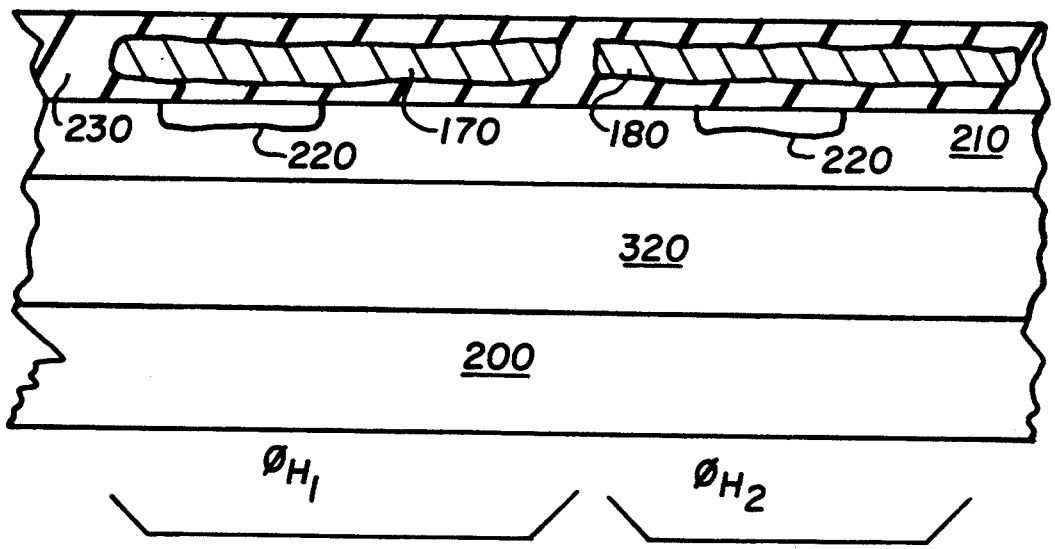
FIG. 8 shows (a) a sectional view along a line A–A' and (b) a sectional view along a line B–B' drawn in FIG. 3 for a two-component buried channel CCD, one component (the n-well) of non-conventional depth.
Figure 8B:
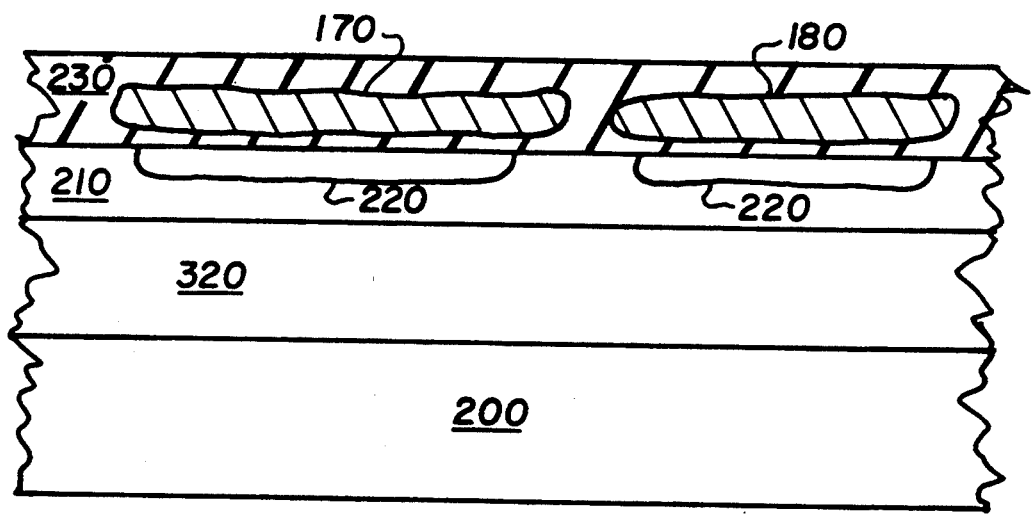

If the FIG. 3 buried channel CCD is replaced by the two-component buried channel CCD structure illustrated in FIG. 8, a substantial improvement in the fringing field strength can be achieved, as shown in curve C of FIG. 6. As before, the electric field for the structure is obtained from a simulation along line A-A' of FIG. 3. The deep CCD structure comprises the conventional (shallow) phosphorus buried channel 210 plus a deep phosphorus channel (n-well) 320 formed by a high energy ion implantation and a drive-in step. Channel 320 may have a depth of anywhere from 1.5 to 3.5 microns. A typical impurity profile for the structure is illustrated in FIG. 9.

Figure 9:
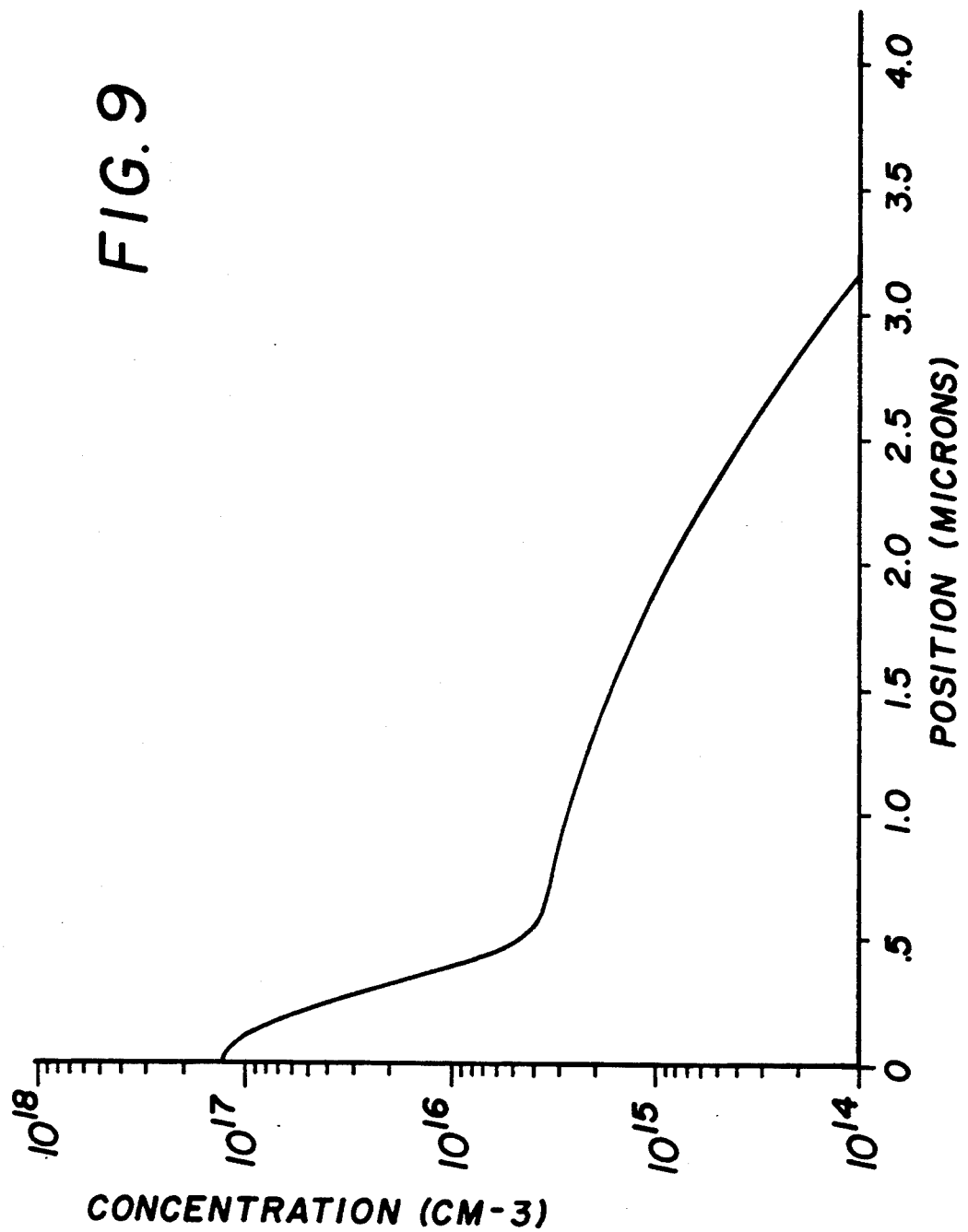
FIG. 9 is a diagram of an impurity profile for the two-component buried channel shown in FIG. 8.
Figure 10:
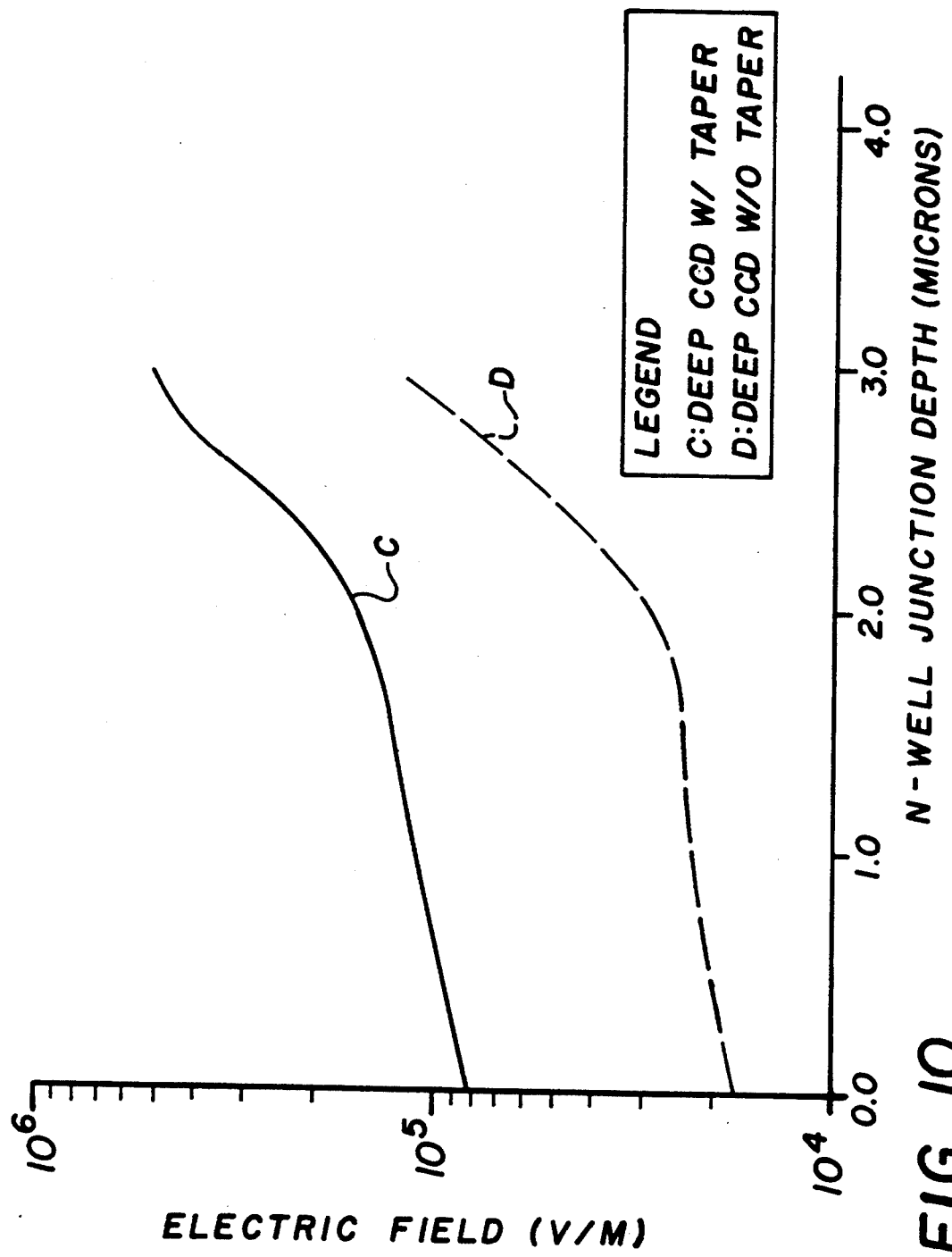
FIG. 10 is a diagram of an average fringing electric field in a storage region along a line A–A' of FIG. 3 as a function of n-well junction depth in the two-component buried channel CCD structure shown in FIG. 8.

As shown in FIG. 9, a typical depth of the n-well implant is 2.5 $\mu$m, several times deeper than the depth of the conventional buried channel profile. Deeper junctions provide greater phase-to-phase coupling of the electric field and, as found from our three-dimensional simulation studies, maintains the narrow channel effect, as shown in FIGS. 6 and 10. Furthermore, it is important to note that due to the presence of the taper in conjunction with the deep vertical profile, as taught by the present invention, the electric field effects are actually three-dimensional and are optimized most appropriately with three-dimensional simulation tools.

For the two-component, deep junction CCD device described in FIG. 9 and with the taper pattern of FIG. 3, the electric field in the direction of charge transfer is calculated to be $4.46 \times 10^5$ V/m, almost 6 times greater than the field obtained in the conventional design, as shown by curve C of FIG. 6.

Therefore, as a result of the enhanced fringing electric fields, charge-transfer efficiency in the two-component, deep junction CCD devices can be improved by a factor of 20 over that obtained from the shallow, conventional junction CCD devices. The charge transfer inefficiency measured for several deep junction devices with various junction depths are reported in FIG. 7, again normalized to the value obtained for the conventional i.e., shallow CCD device without taper. Moreover, as illustrated in FIG. 7, the improvement in charge transfer efficiency is apparent for small ($\frac{1}{4}$ saturation) and large ($\frac{1}{2}$ saturation) charge levels, therefore not incurring certain limitations with respect to signal magnitudes (supra, U.S. Pat. No. 4,667,213 to Kosonocky).

When the tapered region 197, shown in FIG. 3, is removed from the two-component buried channel structure, the electric field is greatly reduced, as shown by curve D in FIG. 6. In fact, the electric field produced by the two-component buried channel structure without the tapered pattern is seen to offer little advantage over that provided by a conventional CCD with taper. To further illustrate the advantages of the two-component deep CCD with tapers or conversely the disadvantages of a CCD device with deep channels, only, and no taper, FIG. 10 is provided. In FIG. 10, the minimum electric field strength in the CCD phase is plotted against the depth of the n-well. In the plot, two deep CCD devices have been studied; one with a taper and one without the tapered region. Observe that for the long phase (that is, greater than 10 microns) CCD devices described here, junction depths of at least 2.5 microns would be needed in a device without a taper just to equal the electric field produced by the conventional, shallow CCD with taper. However, it should be recalled from the discussion of the prior art that a CCD shift register composed of such devices at this minimal level of electric field would most likely require multiple outputs in order to provide a high resolution image. Thus, by optimizing the electric field by inclusion of the deep buried channel, and in conjunction with a tapered pattern, the high electric fields necessary for single output operation are more readily achieved.

Further consideration of FIG. 10, moreover, shows that use of the deep CCD device in conjunction with the tapered pattern actually minimizes the requirement on the depth of the n-well junction. Because deep junctions are formed by a lengthy drive-in step at elevated temperatures (cf. Tsaur, supra) inclusion of the tapered pattern can, therefore, result in lower manufacturing costs and quicker turn-around times in the fabrication of the imager arrays. In particular, for a low temperature operation of the devices, the use of a taper pattern provides a means for achieving high electric fields in an n-well device without compounding the carrier freeze-out problem due to excessively deep junctions and therefore excessively high n-well dosages. Since the trapping rate of carriers is directly proportional to the number of trapping or donor sites, high dosages to produce deep n-wells can, therefore, offset the gains obtained from the higher electric fields.

What is claimed is:

1. A charge coupled device having an image sensing section and at least one horizontal shift register immediately adjacent the image sensing section, the improvement being within the architecture of the horizontal shift register comprising:
   a) a substrate of semiconductor material of one conductivity type used to fabricated the horizontal shift register;
   b) a first buried channel formed in a region of the substrate on the horizontal shift register and of a conductivity type opposite to that of the substrate;
   c) a second buried channel of a conductivity type opposite to that of the substrate formed in the same region of the substrate as the first buried channel and having a greater depth of penetration into the substrate than the first buried channel;
   d) pairs of compensated and uncompensated regions formed at intervals in the buried channels for containing individual packets of charge, each such compensated region being composed of a plurality of rectangularly shaped areas from which protrude tapered extensions, the rectangularly shaped areas and taped extensions recur periodically across a substantial portion of the horizontal shift register, along the buried channels to thereby induce a narrow channel effect and produce a fringing electric field in a direction of charge transfer in the uncompensated buried channel regions;

e) electrode gates associated with each pair of adjoining compensated and uncompensated regions in the device; and f) means for clocking the electrodes for causing a string of charge packets to be transferred.

2. The device as set forth in claim 1, wherein the first buried channel has a higher surface doping concentration than the second buried channel for providing higher charge capacity and means for isolating the charge packets from a semiconductor surface.

3. The device as set forth in claim 1, wherein the silicon substrate is p-type silicon and the buried channels are n-type.

4. The device as set forth in claim 1, wherein the first buried channel is less than 1.0 micron deep from a first surface of the substrate.

5. The device as set forth in claim 1, wherein the second buried channel is formed by phosphorous.

6. The device as set forth in claim 1, wherein the depth of the second buried channel is from 1.5 to 3.5 microns.

7. The device as set forth in claim 1, wherein the compensated regions are spaced so that they form the pairs of compensated and uncompensated regions selected to be between 10 and 15 microns in length and disposed along the buried channels so that a pattern of such compensated and uncompensated pairs is repeated along the charge coupled device's entire length.

8. The device as set forth in claim 1, wherein the rectangular-shaped area is from 2 to 6 microns in length along the buried channels, and the tapered extensions are from 4 to 6 microns in length and vary in width from 2 to 5 microns relative to the channels.

9. The device as set forth in claim 1, comprising two phase clocking means.

10. A charge coupled device having an image sensing region with a horizontal shift register designed for improved charge-transfer efficiency any temperature comprising;

a) a substrate of semiconductor material of one conductivity type used to form the horizontal register;

b) a first buried channel formed in a region of the substrate and the horizontal register having a conductivity type opposite to that of the substrate;

c) a second buried channel within the substrate of the horizontal register having conductivity type opposite to that of the substrate formed in the same region of the substrate as the first buried channel and having a greater depth of penetration into the substrate than the first buried channel;

d) pairs of compensated and uncompensated regions formed at intervals in the buried channels for containing individual packets of charge, each such compensated region being composed of one or more rectangularly shaped areas from which protrude tapered extensions along the buried channels and repeated so as to cover the entire width of the device to thereby induce a narrow channel effect and produce a fringing electric field in a direction of charge transfer in the uncompensated buried channel regions;

e) electrode gates associated with and insulated from each pair of adjoining compensated and uncompensated regions in the device; and f) means for clocking the electrodes for causing a string of charge packets to be transferred through the device.

11. The device as set forth in claim 10, wherein the first buried channel has a higher surface doping concentration than the second buried channel for providing higher charge capacity and a means for isolating the charge packets from semiconductor surface.

12. The device as set forth in claim 10, wherein the substrate is p-type silicon and the buried channels are n-type materials.

13. The device as set forth in claim 10, wherein the first buried channel is less than 1.0 micron deep.

14. The device as set forth in claim 10, wherein the first buried channel is formed by phosphorus.

15. The device as set forth in claim 10, wherein the depth of the second buried channel is from 1.5 microns to 3.5 microns.

16. The device as set forth in claim 10, wherein the compensated regions are spaced so that they form pairs of compensated and uncompensated region selected to be between 10 and 15 microns in length and disposed along the buried channels so that a pattern of such compensated and uncompensated pairs is repeated along the entire length of the device.

17. The device as set forth in claim 10, wherein the rectangular-shaped area is from 2 to 6 microns in length along the buried channels, and the tapered extensions are from 4 to 6 microns in length and vary in width from 2 to 5 microns relative to the channels.

18. The device as set forth in claim 10, comprising two phase clocking means.

19. A charge coupled device having an image sensing region with a horizontal shift register designed for improved charge transfer immediately adjacent the image comprising:

a) a substrate of semiconductor material of one conductivity type used to form the horizontal shift register;

b) a first buried channel formed in a region of the substrate on the horizontal shift register and of a conductivity type opposite to that of the substrate;

c) a second buried channel having a conductivity type opposite to that the substrate formed in the same region of the substrate as the first buried channel and having a greater depth of penetration into the substrate than the first buried channel;

d) pairs of compensated and uncompensated regions formed at intervals in the buried channels for containing individual packets of charge, each such compensated region being composed of at least one rectangularly shaped area from which protrude tapered extensions, the rectangularly shaped areas and tapered extensions recurring periodically across a substantial portion of the horizontal shift register, along the buried channels to thereby induce a narrow channel effect and produce a fringing electric field in a direction of a charge transfer in the uncompensated buried channel regions;

e) electrode gates associated with each pair of adjoining compensated and uncompensated regions in the device; and f) means for clocking the electrodes for causing a string of charge packets to be transferred through the device.

* * * * *

UNITED STATES PATENT AND TRADEMARK OFFICE
CERTIFICATE OF CORRECTION

PATENT NO. : 5,448,089
DATED : September 5, 1995
INVENTOR(S) : Edmund K. Banghart, et. al.

It is certified that error appears in the above-indentified patent and that said Letters Patent is hereby corrected as shown below:

Column 9, line 12, please delete "silicon" (first occurrence).

Column 9, line 39, after "efficiency" please insert --at--.

Column 10, line 8, after "from" please insert --a--.

Column 10, line 35, after "transfer" please delete "immediately adjacent the image".

Signed and Sealed this

Twelfth Day of December, 1995

Attest:

BRUCE LEHMAN

Attesting Officer     Commissioner of Patents and Trademarks